United States Patent [19]

McKee

[11] Patent Number: 5,098,540
[45] Date of Patent: Mar. 24, 1992

[54] METHOD FOR DEPOSITING CHROMIUM COATINGS FOR TITANIUM OXIDATION PROTECTION

[75] Inventor: Douglas W. McKee, Burnt Hills, N.Y.

[73] Assignee: General Electric Company, Schenectady, N.Y.

[21] Appl. No.: 479,009

[22] Filed: Feb. 12, 1990

[51] Int. Cl.$^5$ .............................................. C23C 14/40
[52] U.S. Cl. ............................ 204/192.15; 204/192.16
[58] Field of Search ....................... 204/192.15, 192.16

[56] References Cited

U.S. PATENT DOCUMENTS

| 3,632,494 | 1/1972 | Herte et al. | 204/192.16 X |
| 3,635,811 | 1/1972 | Lane | 204/192.16 X |
| 3,774,703 | 11/1973 | Sanderson | 204/192.16 X |
| 4,139,942 | 2/1979 | Sastri et al. | 204/192.15 X |
| 4,761,346 | 8/1988 | Naik | 428/627 |

Primary Examiner—Nam X. Nguyen
Attorney, Agent, or Firm—James E. McGinness; James C. Davis, Jr.; James Magee, Jr.

[57] ABSTRACT

A coating comprised of a continuous film of about 1 to 10 microns of condensed high energy atoms of chromium is found to remain adherent on titanium substrates during repeated thermal recycling while providing substantial oxidation protection up to about 909° C. A film of a ductile chromium alloy that forms a continuous chromium oxide scale can be used instead of the chromium film. The film is deposited by physical vapor deposition processes depositing atoms having a high kinetic energy.

5 Claims, 2 Drawing Sheets

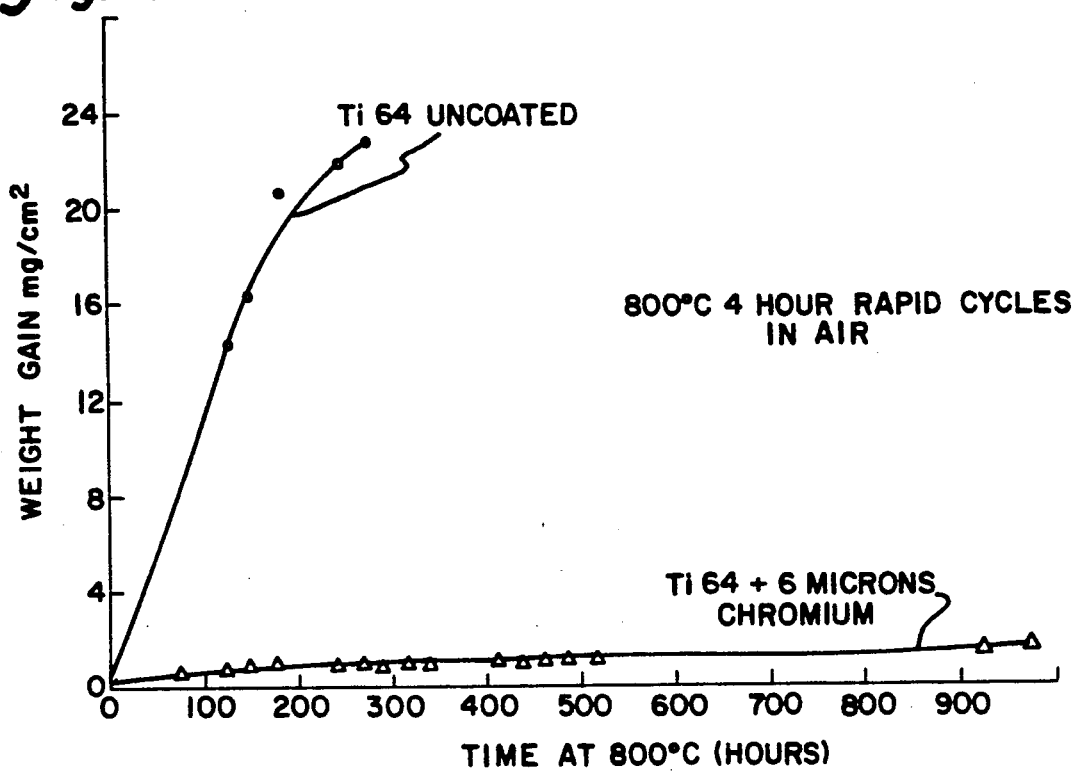
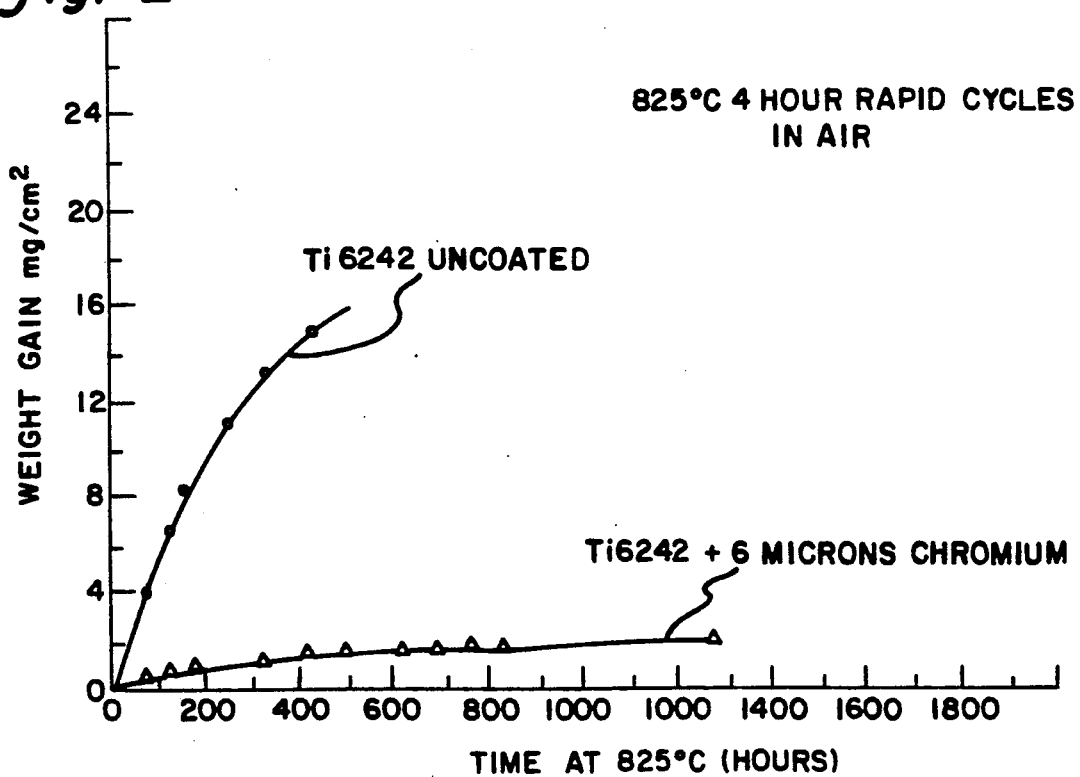

METHOD FOR DEPOSITING CHROMIUM COATINGS FOR TITANIUM OXIDATION PROTECTION

This invention relates to chromium coatings that provide substantial oxidation protection for titanium and titanium alloys, while remaining adherent during repeated thermal cycling.

The components of a gas turbine are heated during the operation of the turbine and then cooled to room temperature when the turbine is stopped. The heating and cooling cycle can be repeated several times a day, for example in an aircraft engine gas turbine, or more infrequently on a weekly or monthly basis, for example in a gas turbine used in power generation. The term "repeated thermal cycling" is used herein to refer to the type of thermal cycling experienced by the components of a gas turbine in the normal operation of the gas turbine.

There is great technological interest in high strength, low density materials suitable for high temperature use such as titanium and titanium alloys. It is well known such low density materials will improve the thrust to weight ratio and efficiency of gas turbine aircraft engines. A serious limitation to the use of titanium and most titanium alloys in high temperature applications, above about 600° C., is the affinity of titanium for oxygen. Oxygen embrittles titanium, causing a reduction in toughness and creep resistance. Titanium also oxidizes at relatively low temperatures forming a spalling oxide scale at about 600° C.

Metals that form spalling oxide scales are particularly undesirable for high temperature use because the metal surface continually corrodes leading to premature failure of the metal from mechanisms such as stress corrosion cracking. A more desirable oxide scale remains tightly adherent to the metal surface and has a low diffusivity for oxygen thereby retarding further oxidation of the metal substrate. A protective oxide scale on titanium would also reduce the diffusion of oxygen into the metal so that toughness and creep resistance are not adversely reduced. Because titanium has a high affinity for oxygen, many titanium alloys are similarly embrittled and form spalling oxide scales. Components or structural members formed from titanium or titanium alloys are sometimes herein referred to as titanium substrates.

Improvement in the resistance to oxidation of titanium substrates has been sought through the addition of alloying elements that form protective scales. However such alloy additions have not been entirely satisfactory either because oxidation protection is inadequate, or mechanical properties are adversely affected. For example, chromium additions of a few weight percent in titanium substrates have been shown to increase the oxidation rate of titanium. By increasing the chromium addition to at least about 17 weight percent minor reductions in the oxidation rate of titanium have been observed. Aluminum has been shown to be a more effective addition generally providing greater oxidation protection as the aluminum concentration increases. Intermetallic compounds of titanium and aluminum such as alpha-2, about 25 to 35 atomic percent aluminum, and gamma, about 50 to 60 atomic percent aluminum, have lower oxidation rates than pure titanium, but by less than an order of magnitude. Unfortunately the titanium and aluminum intermetallic compounds are brittle, and their use in the stressed components of a gas turbine has been restricted.

A desirable alternative is coatings that provide substantial oxidation protection to titanium substrates. The predominant aspect of high temperature coating technology is the life expectancy of the coating. The coatings composition, structure, porosity, adhesion, operating and coating temperature, and compatability between the substrate and coating are all considerations in the development of a high temperature coating. Compatability includes minimal diffusion between the coating and substrate to avoid composition changes or the development of embrittling phases. Coating adhesion has been a particularly difficult requirement to satisfy in coatings for gas turbine components because the repeated thermal cycling normally experienced by such components in the operation of a gas turbine can place severe stresses on the coatings.

Various coatings have been applied to titanium substrates to improve their oxidation resistance. For example diffusion coatings of aluminum, silicon, nickel, zinc, chromium, and nickel aluminide have been applied to commercially pure titanium, Nejedlik, J. F., "Protective Coatings for Titanium Alloy Compressor Blades," TRW Report TM-4580, December 1970. The aluminide and silicide coatings were considered more protective than the other diffused coatings because they exhibited low weight gains during oxidation testing at 650° C. for 1000 hour exposure in air.

Pack cementation is a widely used aluminide diffusion coating process. A mixture of an inert oxide, a halide salt and a source of coating metal such as aluminum are placed in a sealed retort. On heating, the salt decomposes and reacts with the coating metal to form a gaseous metal halogen compound. The metal activity in the gas is higher than the substrate so the coating metal reacts and interdiffuses into the substrate. The pack-cementation process was used to deposit aluminide layers about 40 to 50 microns thick on titanium, "High Temperature Cyclic Oxidation of Aluminide Layers on Titanium," Subrahmanyam, I. and Annapurna, J., Oxidation of Metals, Vol. 26, Nos. 3/4, 1986, pp. 275–285. Cyclic oxidation testing at 950° C. caused rapid oxidation and spalling of the aluminide layers. At lower oxidation temperatures the aluminide layers delayed the beginning of rapid oxidation indicating the layers could extend titanium life considerably at 500°–700° C.

Silicide layers of about 10 microns have also been deposited on heated titanium ribbons by the chemical vapor deposition of silane, $SiH_4$. "High-temperature Oxidation of Titanium Silicide Coatings on Titanium," Abba A., Galerie A., and Caillet M., Oxidation of Metals, Vol. 17, No. 1, 1982, pp. 43–54. Though the silicide coatings were oxidation tested without rapid thermal cycling, at 900° C. longitudinal cracks in the scale and accelerated oxidation were observed.

Ion implantation in titanium of aluminum, boron, tin, caesium, and phosphorus was investigated by Pons, et al. "Oxidation of Ion-implanted Titanium in the 750°–950° C. Temperature Range," Journal of the Less Common Metals, Vol. 109, 1985, pp. 45–46. Phosphorus was found to be the most active, but only reduced the rate of oxide growth by a factor of 2.

Physical Vapor Deposition coating processes are well known, covering three major techniques; evaporation, sputtering and ion plating. Variations of each major technique have been developed enabling the deposition of a wide range of materials. In general, a coating material and the substrate on which deposition occurs are contained in a vacuum chamber where the coating material is vaporized, transported to the substrate, and condensed by film nucleation and growth on the substrate. Variations in atmosphere, methods of heating the vapor source, and application of electrical voltage to the substrate can produce different coating structures, deposition rates and properties. However, by using the proper variations in each technique similar coatings can be produced.

The Physical Vapor Deposition processes can be divided into two categories; processes that provide vaporized coating atoms having a low kinetic energy for transport to the substrate, and processes that provide vaporized coating atoms having a high kinetic energy for transport to the substrate. Simple evaporation processes that vaporize the coating material by thermal heating produce low energy atoms having less than about 1 electron volt of kinetic energy. Processes that vaporize the coating material by momentum transfer produce high energy atoms having greater than about 1 electron volt, typically about 10 electron volts, of kinetic energy.

For example in one sputtering process known as diode sputtering, a target that is the source of the coating material is negatively charged by a power supply. The negatively charged target, or cathode, emits electrons. Electrons leaving the surface of the target travel toward a positively charged anode that contains the substrate to be coated. The electrons strike and ionize one or more atoms in their path, the atoms typically being an inert gas such as argon. The positively charged ions formed in the collision are accelerated back to the negatively charged target. The energy of the collision between the target and ions is deposited in the target material as phonon excitation. Some of these excitations lead to the release of neutral atoms from the target surface having an increased kinetic energy of about 10 electron volts, enabling the atoms to travel to the substrate in a random way and grow into a film.

Some other coating processes that deposit highly energized atoms of a coating material are Ion beam sputtering and Ion plating. For further information concerning Physical Vapor Deposition coating processes reference is made to "Glow Discharge Processes," Chapman, B., John Wiley & Sons Inc., New York, 1980, and "Metallic and Ceramic Coatings: Production, High Temperature Properties and Applications," Hocking, M. G., Vasantasree, V., Sidky, P. S., Longman Scientific and Technical, Essex, England, 1989.

It is an object of this invention to provide an adherent continuous coating capable of withstanding repeated thermal cycling while providing substantial oxidation protection on titanium substrates at temperatures up to about 900° C.

Another object is to provide an adherent continuous chromium coating capable of withstanding repeated thermal cycling while providing substantial oxidation protection on titanium substrates at temperatures up to about 900° C.

Another object is to provide adherent continuous chromium alloy coatings that form a continuous chromium oxide scale. The chromium alloy coatings being capable of withstanding repeated thermal cycling while providing substantial oxidation protection on titanium substrates at temperatures up to about 900° C.

Another object of this invention is a method for protecting titanium substrates from oxidation up to about 900° C. under conditions of repeated thermal cycling such as experienced by the components of a gas turbine.

BRIEF DESCRIPTION OF THE INVENTION

I have discovered a coating for titanium substrates that remains adherent during repeated thermal cycling while providing substantial oxidation protection for the substrate at elevated temperatures up to about 900° C. The coating is comprised of a continuous film of condensed high energy atoms of chromium, the film being about 1 to 10 microns, preferably about 3 to 6 microns. Alternatively, a film of condensed high energy atoms of a ductile chromium alloy that forms a continuous chromium oxide scale can be used instead of the chromium film. The term "film of condensed high energy atoms" means a film that is formed by the condensation of atoms having a kinetic energy of at least 1 electron volt onto a substrate. Adherent, continuous chromium or chromium alloy films that provide substantial oxidation protection are formed on titanium substrates by physical vapor deposition processes depositing atoms having a high kinetic energy.

A preferred coating process for depositing atoms having a high kinetic energy is performed by diode sputtering with a radio frequency current. First the substrate is polished and then cleaned to remove contaminants such as dirt, carbonaceous deposits, and oxides. The cleaned substrate is centrally located on an anode in the sealed sputtering chamber that is reduced to a vacuum.

A chromium target that is the source of the coating material is negatively charged by a power supply. The negatively charged chromium target, or cathode, emits electrons. Electrons leaving the surface of the target travel through an argon plasma toward a positively charged anode that contains the titanium substrate. The electrons strike and ionize one or more argon atoms in their path. The positively charged ions formed in the collision are accelerated back to the negatively charged target. The collision between the argon ions and the chromium target causes the release of chromium atoms from the target surface having an increased kinetic energy of about 10 electron volts, enabling the chromium atoms to travel to the titanium substrate in a random way and grow into a film.

The term "atoms having a high kinetic energy" means the atoms have a kinetic energy of at least about 1 electron volt.

BRIEF DESCRIPTION OF THE DRAWINGS

FIGS. 1-3 are graphs showing the oxide weight gain on a titanium substrate as compared to the oxide weight gain on a titanium substrate having an adherent chromium coating.

DETAILED DESCRIPTION OF THE INVENTION

Figure 3:
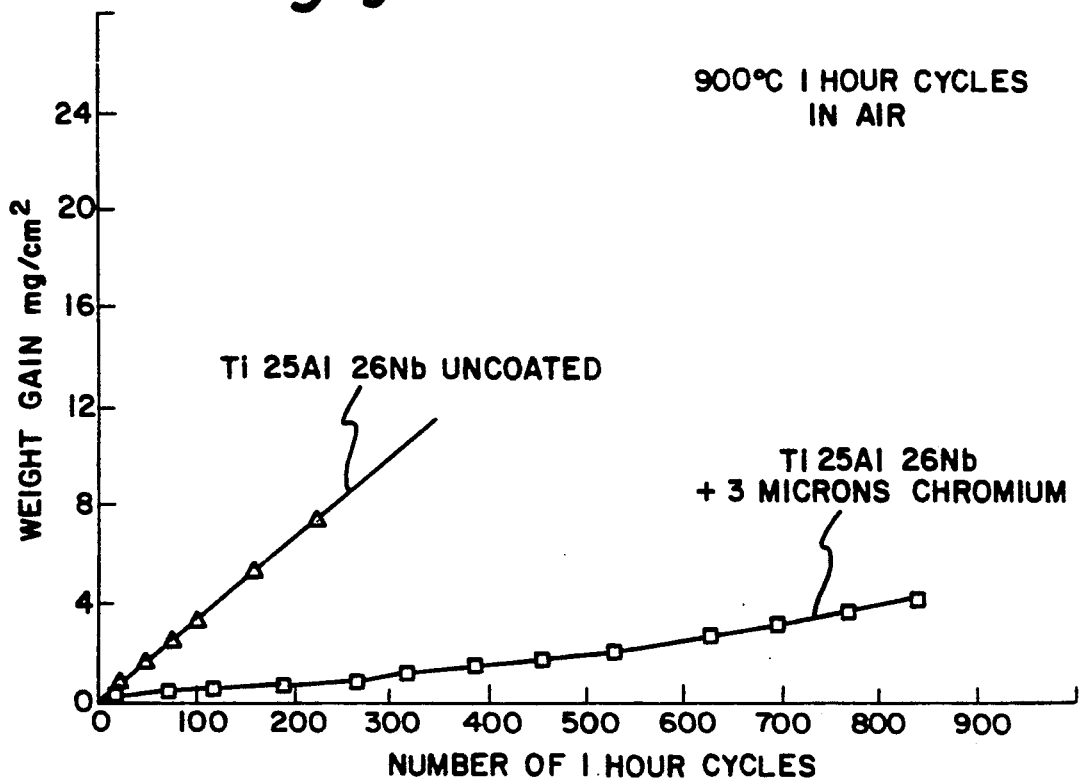

Many coatings have been applied to titanium substrates, but coatings heretofore reported have proven inadequate for high temperature oxidation protection when exposed to the thermal cycling experienced by gas turbine components. However, I have discovered that a relatively thin coating of about 1 to 10 microns, preferably about 3 to 6 microns, of chromium deposited by the condensation of atoms having a high kinetic energy, provides substantial oxidation protection for titanium substrates. Surprisingly, when subjected to the stress caused by repeated thermal cycling in air between room temperature and up to about 900° C., the coating remains adherent and reduces the rate of oxide growth on titanium substrates from a substantially linear rate to a substantially parabolic rate.

Ductile chromium alloys that form continuous chromium oxide scales can be used as the coating material instead of chromium. Such ductile chromium alloys are, for example, comprised of about 20 to 50 weight percent chromium and the balance nickel, or about 30 to 50 weight percent chromium and the balance cobalt, or about 30 to 50 weight percent chromium and the balance iron.

Physical Vapor Deposition coating processes that deposit atoms having a high kinetic energy are used to apply the coatings disclosed above. For example, diode sputtering with a radio frequency current can be used to deposit chromium or chromium alloy coatings of about 1 to 10 microns. Such chromium or chromium alloy coatings are continuous so that no bare spots on the titanium substrate are exposed to oxidative attack, and strongly adherent so that the coating does not spall from the substrate even after repeated thermal cycling between room temperature and elevated temperatures up to about 900° C.

The following examples further show the deposition of high energy chromium atoms, or high energy atoms of the constituents of chromium alloys, as continuous adherent coatings on titanium substrates.

EXAMPLE 1

Coupons of approximately $\frac{1}{2}'' \times \frac{1}{4}'' \times \frac{1}{8}''$ were prepared from large samples having the compositions shown in Table 1 below.

TABLE 1

| Coupon Designation | Composition Weight Percent |
|---|---|
| Ti | Ti-0.18Fe-0.02C |
| Ti 64 | Ti-6Al-4V |
| Ti 6242 | Ti-6Al-2Sn-4Zr-2Mo |
| Ti-25Al-26Nb* | Ti-12.4Al-44.4Nb |

Note Titanium is the balance of each composition
*Designation based on atomic percent The coupons were polished on silicon carbide paper down to 600 mesh on all surfaces and then ultrasonically cleaned in acetone and rinsed in methanol. The coupons were coated with chromium by the anode sputtering process in a Perkin-Elmer 2400 sputtering machine by the following procedure. A chromium target of about 99.999% purity was used to form a cathode assembly. The coupons were centrally located on an anode spaced about 1¾ inch from the target. The anode and cathode were sealed in a chamber reduced to a pressure of $2 \times 10^{-6}$ atmospheres for about 1 hour to allow for the removal of water vapor and other contaminants from the chamber.

The chromium target was sputter cleaned by rotating a blank anode under the target and applying a radio frequency current of 13.56 megahertz for 60 minutes to the cathode target and the anode. An argon plasma was formed between the electrodes by introducing argon gas at a rate of 80 milliliters per minute between the anode and cathode to maintain a vessel pressure of 3.2 torr. After the target was cleaned the anode holding the coupons was rotated back under the cathode. The coupons were then sputtered by applying the radio frequency current at 350 watts and 2400 volts for 3.5 hours.

A chromium coating of about 3 microns was deposited on the coupon surface facing the target. The sputtering procedure was repeated a second time with the opposite coupon surface facing the target. It should be understood that a chromium coating of about 3 microns was also deposited on the sides of the coupons perpendicular to the target by this procedure. This sputtering procedure was repeated a second time to form a total coating thickness of 6 microns on coupons having the Ti 64 and Ti 6242 substrates shown in Table 1.

Using the sputtering procedure explained above three coupons having the Ti 64 composition in Table 1 were coated with a noble metal coating of about 3 microns. Using a platinum target one coupon was coated with platinum, using an iridium target a second coupon was coated with iridium, and using an alloy target of platinum and 10 atomic percent ruthenium the third coupon was coated with the platinum and ruthenium alloy.

A chromium alloy target comprised of about 20 weight percent chromium and the balance nickel was used to deposit a 6 micron chromium alloy coating on a Ti 64 coupon. The sputtering procedure described above and repeated a second time to deposit a 6 micron coating was used.

EXAMPLE 2

A chromium coating was applied by the pack-cementation process on coupons having the Ti substrate in Table 1. The coupons were inserted in a powder pack consisting of, in weight percent, about 65% chromium powder, about 25% alumina powder, and about 10% ammonium chloride. The pack was heated to about 1000° C. for about 1 hour in an atmosphere of hydrogen and argon, forming a chromium coating of about 50 microns. A bronze colored surface layer believed to be comprised of chromium and titanium intermetallic compounds was observed on the coupons.

EXAMPLE 3

The oxidation protection provided by the coatings applied in Examples 1 and 2 was measured by heating coated and uncoated coupons having the same titanium substrate. The coupons were heated in flowing air and the weight gain on the coupons from oxide growth was measured on automatically recording thermal balances. The weight gain measurements are shown by the curves in FIGS. 1-4, where the weight gain in milligrams per square centimeter is plotted on the ordinate as a function of exposure time as plotted on the abscissa. The coupons in FIGS. 1, 2, and 4 were thermally cycled every 4 hours by cooling the coupons to room temperature and then reheating them to the test temperature shown in each figure. The coupons in FIG. 3 were thermally cycled every hour in the same manner.

Figure 4:
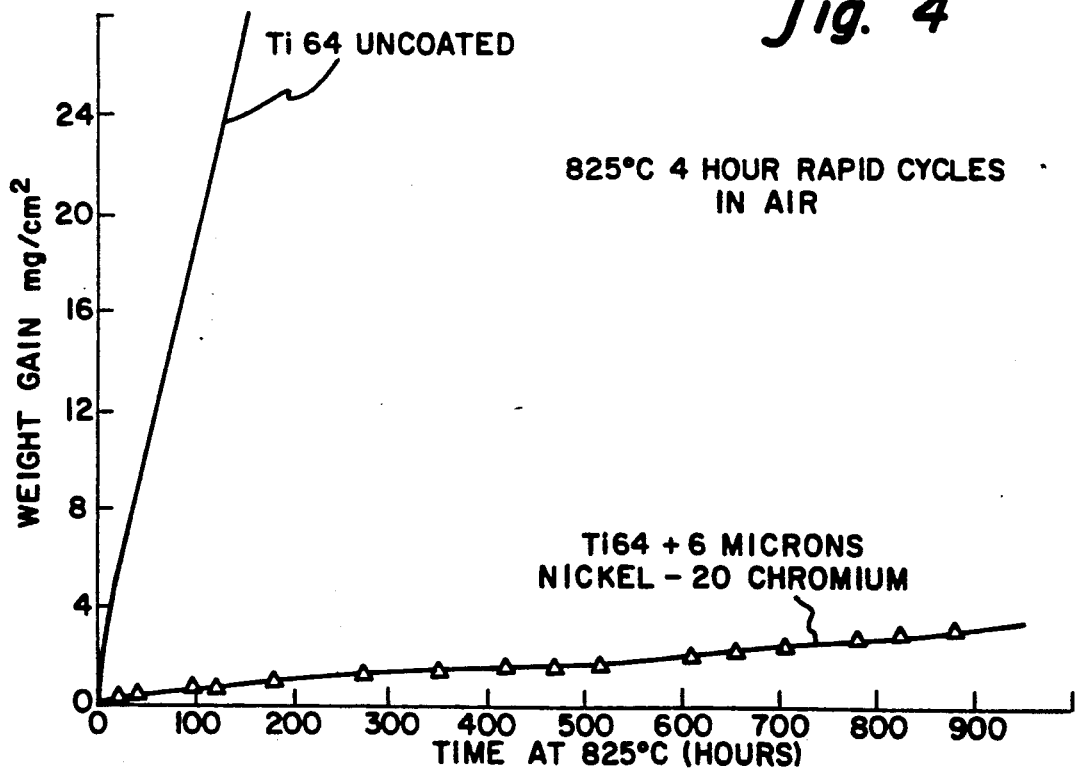
FIG. 4 is a graph showing the oxide weight gain on a titanium substrate as compared to the oxide weight gain on a titanium substrate having an adherent coating of a chromium alloy.

FIG. 1 shows the weight gain for uncoated and chromium coated coupons, having the Ti 64 substrate in Table 1, that were heated to 800° C. for over 900 hours with periodic thermal cycling. FIG. 2 shows the weight gain for uncoated and chromium coated coupons, having the Ti 6242 substrate in Table 1, that were were heated to 825° C. for over 1200 hours with periodic thermal cycling. FIG. 3 shows the weight gain for uncoated and chromium coated coupons, having the Ti- 25Al-26Nb substrate in Table 1, that were heated to 900° C. for about 824 hours with periodic thermal cycling. FIG. 4 shows the weight gain for uncoated and chromium alloy coated coupons, having the Ti 64 substrate in Table 1, that were were heated to 825° C. for over 900 hours with periodic thermal cycling.

Each figure shows the substantial oxidation protection provided by the sputtered chromium or chromium alloy coating. The uncoated coupons experienced rapid weight gains, spalling of the oxide scale, and oxidized at an essentially linear rate. Uncoated coupons shown in FIGS. 1 and 2 had become completely oxidized in about 400 hours. The coated coupons experienced greatly reduced oxide weight gains of less than about 4 mg/cm$^2$ in about 900 hours or more of exposure to an oxidizing atmosphere with repeated thermal cycling.

From the slope of the curves for the coated coupons it can be seen that the coated coupons oxidized at a substantially parabolic rate characteristic of the oxidation rate for materials having a protective oxide scale. There was no visible evidence of spalling on any of the coated coupons after the extensive oxidation tests. As shown by comparing FIG. 3 to FIGS. 1,2, and 4, the 3 micron coating on the Ti-25Al-26Nb coupon provided similar oxidation protection as compared to the 6 micron coatings on the Ti 64 and Ti 6242 coupons.

By contrast, the noble metal coatings applied in Example 1 spalled rapidly when heated to 900° C. with periodic cooling to room temperature. Similarly, the chromium coatings applied in Example 2 by the pack-cementation process readily spalled on heating in air at 855° C.

Examination of chromium coated coupons by a scanning electron microscope after oxidation testing showed minor diffusion of the chromium in the substrate, the diffusion being limited to within about 8 microns of the coupon surface. Such minimal diffusion further shows the stability of the sputtered chromium coating and the ability of the coating to provide a long life of adherence and oxidation protection.

The coatings disclosed herein provide excellent oxidation protection on titanium substrates that is characteristic of the oxidation protection provided by protective oxide scales. Protective oxide scales substantially reduce the rate of oxidation on the substrate by substantially reducing the diffusion of oxygen through the scale to the substrate. Therefore it is expected that the coatings of this invention, in addition to providing oxidation protection, also minimize the diffusion of oxygen into the titanium substrate so that the substrate is not embrittled and ductility, toughness, and resistance to creep are not adversely reduced.

We claim:

1. A method for protecting titanium substrates from oxidation, consisting of:
    cleaning the titanium substrate to remove surface contaminants; and
    depositing a continuous coating of chromium, or a ductile chromium alloy that forms a continuous chromium oxide scale, of about 1 to 10 microns by condensing atoms having a high kinetic energy onto the substrate, the coating remaining adherent after repeated thermal cycling.

2. The method of claim 1 wherein before the step of cleaning, polishing the substrate.

3. The method of claim 1 wherein a coating is about 3 to 6 microns.

4. The method of claim 1 wherein the coating is deposited by sputtering.

5. The method of claim 4 wherein the sputtering is diode sputtering with a radio frequency current.

* * * * *